(12) United States Patent
Choi

(10) Patent No.: US 8,299,705 B2
(45) Date of Patent: Oct. 30, 2012

(54) ORGANIC LIGHT EMITTING DISPLAY DEVICE AND MANUFACTURING METHOD THEREOF

(75) Inventor: Dong Soo Choi, Yongin-si (KR)

(73) Assignee: Samsung Display Co., Ltd. (KR)

( * ) Notice: Subject to any disclaimer, the term of this patent is extended or adjusted under 35 U.S.C. 154(b) by 910 days.

(21) Appl. No.: 11/529,995

(22) Filed: Sep. 29, 2006

(65) Prior Publication Data

US 2007/0171637 A1    Jul. 26, 2007

(30) Foreign Application Priority Data

Jan. 26, 2006 (KR) .................. 10-2006-0008462
Feb. 20, 2006 (KR) .................. 10-2006-0016188

(51) Int. Cl.
*H01J 1/62* (2006.01)
(52) U.S. Cl. ........................ 313/512; 445/25
(58) Field of Classification Search .......... 313/512; 501/15
See application file for complete search history.

(56) References Cited

U.S. PATENT DOCUMENTS

| | | | |
|---|---|---|---|
| 3,966,449 A | | 6/1976 | Foster |
| 4,004,936 A | * | 1/1977 | Powell .................. 501/15 |
| 4,105,292 A | | 8/1978 | Conder et al. |
| 4,238,704 A | | 12/1980 | Bonk et al. |
| 4,702,566 A | | 10/1987 | Tukude |
| 4,826,297 A | | 5/1989 | Kubo et al. |
| 4,984,059 A | | 1/1991 | Kubota et al. |
| 5,808,719 A | | 9/1998 | Fujiwara et al. |
| 5,811,927 A | | 9/1998 | Anderson et al. |
| 5,965,907 A | | 10/1999 | Huang et al. |
| 6,005,653 A | | 12/1999 | Matsuzawa |
| 6,087,717 A | | 7/2000 | Ano et al. |

(Continued)

FOREIGN PATENT DOCUMENTS

CN     1290121 A     4/2001

(Continued)

OTHER PUBLICATIONS

Notice of Allowance issued Aug. 2, 2007 in counterpart Korean Patent Application No. 10-2006-0016188.

(Continued)

*Primary Examiner* — Anh Mai
*Assistant Examiner* — Andrew Coughlin
(74) *Attorney, Agent, or Firm* — Knobbe Martens Olson & Bear LLP

(57) ABSTRACT

Disclosed is a manufacturing method of an organic light emitting display device, which allows a frit to be sufficiently fused by illuminating a laser beam such that a width of the laser beam may be above a width of the frit by adjusting power of the laser beam. The manufacturing method of an organic light emitting display device comprises the steps of: a) forming an organic light emitting element comprising a first electrode, an organic thin film and a second electrode on a pixel region of a first substrate divided into the pixel region and a non-pixel region; b) forming a flit along a surrounding of a second substrate corresponding to the non-pixel region; c) arranging the second substrate on an upper side of the first substrate to be superposed to a part of the pixel region and the non-pixel region; and d) attaching the first substrate and the second substrate by illuminating laser beam with a width above a width of the frit from a back surface of the second substrate.

13 Claims, 10 Drawing Sheets

U.S. PATENT DOCUMENTS

| | | | |
|---|---|---|---|
| 6,109,994 A | 8/2000 | Cho et al. | |
| 6,195,142 B1 | 2/2001 | Gyotoku et al. | |
| 6,210,815 B1 | 4/2001 | Ooishi | |
| 6,211,938 B1 | 4/2001 | Mori | |
| 6,288,487 B1 | 9/2001 | Arai | |
| 6,424,009 B1 | 7/2002 | Ju | |
| 6,452,323 B1 | 9/2002 | Byrum et al. | |
| 6,489,719 B1 | 12/2002 | Young et al. | |
| 6,495,262 B2 | 12/2002 | Igeta | |
| 6,515,417 B1 | 2/2003 | Duggal et al. | |
| 6,551,724 B2 | 4/2003 | Ishii et al. | |
| 6,554,672 B2 | 4/2003 | Dunham et al. | |
| 6,555,025 B1 | 4/2003 | Krupetsky et al. | |
| 6,565,400 B1 | 5/2003 | Lee et al. | |
| 6,590,337 B1 | 7/2003 | Nishikawa et al. | |
| 6,603,254 B1 | 8/2003 | Ando | |
| 6,605,826 B2 | 8/2003 | Yamazaki et al. | |
| 6,624,572 B1 | 9/2003 | Kim et al. | |
| 6,646,284 B2 | 11/2003 | Yamazaki et al. | |
| 6,650,392 B2 | 11/2003 | Iwangaga et al. | |
| 6,660,547 B2 | 12/2003 | Guenther | |
| 6,671,029 B1 | 12/2003 | Choi | |
| 6,717,052 B2 * | 4/2004 | Wang et al. | 174/381 |
| 6,744,199 B1 | 6/2004 | Tanaka | |
| 6,791,660 B1 | 9/2004 | Hayashi et al. | |
| 6,831,725 B2 | 12/2004 | Niiya | |
| 6,833,668 B1 | 12/2004 | Yamada et al. | |
| 6,861,801 B2 | 3/2005 | Kim et al. | |
| 6,878,467 B2 | 4/2005 | Chung et al. | |
| 6,896,572 B2 | 5/2005 | Park et al. | |
| 6,914,661 B2 | 7/2005 | Masuda et al. | |
| 6,924,594 B2 | 8/2005 | Ogura et al. | |
| 6,936,963 B2 | 8/2005 | Langer et al. | |
| 6,956,324 B2 | 10/2005 | Yamazaki | |
| 6,956,638 B2 | 10/2005 | Akiyama et al. | |
| 6,965,195 B2 | 11/2005 | Yamazaki et al. | |
| 6,980,275 B1 | 12/2005 | Konuma et al. | |
| 6,993,537 B2 | 1/2006 | Buxton et al. | |
| 6,998,776 B2 | 2/2006 | Aitken et al. | |
| 7,030,558 B2 | 4/2006 | Park et al. | |
| 7,098,589 B2 | 8/2006 | Erchak et al. | |
| 7,112,115 B1 | 9/2006 | Yamazaki et al. | |
| 7,141,925 B2 | 11/2006 | Wittmann et al. | |
| 7,154,218 B2 | 12/2006 | Murakami et al. | |
| 7,178,927 B2 | 2/2007 | Seo | |
| 7,186,020 B2 | 3/2007 | Taya et al. | |
| 7,187,121 B2 | 3/2007 | Hasegawa et al. | |
| 7,193,218 B2 | 3/2007 | Nagano | |
| 7,193,364 B2 | 3/2007 | Klausmann et al. | |
| 7,193,366 B2 | 3/2007 | Tomimatsu et al. | |
| 7,202,602 B2 | 4/2007 | Anandan | |
| 7,211,938 B2 | 5/2007 | Tanaka | |
| 7,214,429 B2 | 5/2007 | Kato et al. | |
| 7,247,986 B2 | 7/2007 | Kang et al. | |
| 7,255,823 B1 | 8/2007 | Guether et al. | |
| 7,291,977 B2 | 11/2007 | Kim et al. | |
| 7,306,346 B2 | 12/2007 | Fukuoka et al. | |
| 7,317,281 B2 | 1/2008 | Hayashi et al. | |
| 7,332,858 B2 | 2/2008 | Nomura et al. | |
| 7,342,357 B2 | 3/2008 | Sakano et al. | |
| 7,344,901 B2 | 3/2008 | Hawtof et al. | |
| 7,359,021 B2 | 4/2008 | Ota et al. | |
| 7,371,143 B2 | 5/2008 | Becken et al. | |
| 7,393,257 B2 | 7/2008 | Spencer et al. | |
| 7,407,423 B2 | 8/2008 | Aitken et al. | |
| 7,423,375 B2 | 9/2008 | Guenther et al. | |
| 7,425,166 B2 | 9/2008 | Burt et al. | |
| 7,425,518 B2 | 9/2008 | Yoshida et al. | |
| 7,426,010 B2 | 9/2008 | Lee et al. | |
| 7,452,738 B2 | 11/2008 | Hayashi et al. | |
| 7,474,375 B2 | 1/2009 | Kwak et al. | |
| 7,498,186 B2 | 3/2009 | Lee | |
| 7,514,280 B2 | 4/2009 | Lee | |
| 7,528,544 B2 | 5/2009 | Kwak et al. | |
| 7,537,504 B2 | 5/2009 | Becken et al. | |
| 7,564,185 B2 | 7/2009 | Song et al. | |
| 7,579,203 B2 | 8/2009 | Yamazaki et al. | |
| 7,579,220 B2 | 8/2009 | Ohnuma et al. | |
| 7,585,022 B2 | 9/2009 | Achilles et al. | |
| 7,586,254 B2 | 9/2009 | Kwak et al. | |
| 7,597,603 B2 | 10/2009 | Becken et al. | |
| 2003/0066311 A1 | 4/2003 | Li et al. | |
| 2003/0077396 A1 | 4/2003 | Lecompte et al. | |
| 2003/0122476 A1 * | 7/2003 | Wang et al. | 313/493 |
| 2003/0227252 A1 | 12/2003 | Ikeya et al. | |
| 2004/0069017 A1 | 4/2004 | Li et al. | |
| 2004/0075380 A1 | 4/2004 | Takemoto et al. | |
| 2004/0104655 A1 | 6/2004 | Kodera et al. | |
| 2004/0135520 A1 | 7/2004 | Park et al. | |
| 2004/0169033 A1 | 9/2004 | Kuibira et al. | |
| 2004/0169174 A1 | 9/2004 | Huh et al. | |
| 2004/0206953 A1 | 10/2004 | Morena et al. | |
| 2004/0207314 A1 | 10/2004 | Aitken et al. | |
| 2005/0001545 A1 * | 1/2005 | Aitken et al. | 313/512 |
| 2005/0127820 A1 | 6/2005 | Yamazaki et al. | |
| 2005/0248270 A1 | 11/2005 | Ghosh et al. | |
| 2005/0275342 A1 | 12/2005 | Yanagawa | |
| 2006/0082298 A1 * | 4/2006 | Becken et al. | 313/512 |
| 2006/0084348 A1 | 4/2006 | Becken et al. | |
| 2006/0284556 A1 | 12/2006 | Tremel et al. | |
| 2006/0290261 A1 | 12/2006 | Sawai et al. | |
| 2007/0120478 A1 | 5/2007 | Lee et al. | |
| 2007/0170324 A1 | 7/2007 | Lee et al. | |
| 2007/0170423 A1 | 7/2007 | Choi et al. | |
| 2007/0170605 A1 | 7/2007 | Lee et al. | |
| 2007/0170839 A1 | 7/2007 | Choi et al. | |
| 2007/0170845 A1 | 7/2007 | Choi et al. | |
| 2007/0170850 A1 | 7/2007 | Choi et al. | |
| 2007/0170855 A1 | 7/2007 | Choi et al. | |
| 2007/0170857 A1 | 7/2007 | Choi et al. | |
| 2007/0170859 A1 | 7/2007 | Choi et al. | |
| 2007/0170860 A1 | 7/2007 | Choi et al. | |
| 2007/0170861 A1 | 7/2007 | Lee et al. | |
| 2007/0173167 A1 | 7/2007 | Choi et al. | |
| 2007/0176549 A1 | 8/2007 | Park | |
| 2007/0177069 A1 | 8/2007 | Lee | |
| 2007/0197120 A1 | 8/2007 | Lee | |
| 2007/0232182 A1 | 10/2007 | Park | |
| 2008/0074036 A1 | 3/2008 | Wang et al. | |

FOREIGN PATENT DOCUMENTS

| | | |
|---|---|---|
| CN | 1438825 | 8/2003 |
| CN | 1551686 A | 12/2004 |
| CN | 1577413 | 2/2005 |
| CN | 161636 | 5/2005 |
| CN | 1212662 | 7/2005 |
| CN | 1670570 | 9/2005 |
| JP | 030-37933 | 2/1991 |
| JP | 04-147217 | 5/1992 |
| JP | 04-301879 | 10/1992 |
| JP | 06-34983 | 2/1994 |
| JP | 06-337429 | 10/1994 |
| JP | 07-74583 | 3/1995 |
| JP | 09-258671 | 3/1997 |
| JP | 09-278483 | 10/1997 |
| JP | 10-74583 | 3/1998 |
| JP | 10-074583 | 3/1998 |
| JP | 10-125463 | 5/1998 |
| JP | 10-161137 | 6/1998 |
| JP | 63-163423 | 7/1998 |
| JP | 10-201585 | 8/1998 |
| JP | 11-007031 | 1/1999 |
| JP | 11-202349 | 7/1999 |
| JP | 2001-022293 | 1/2001 |
| JP | 2001-052858 | 2/2001 |
| JP | 2001-55527 | 2/2001 |
| JP | 2001-203076 | 2/2001 |
| JP | 2001-110564 | 4/2001 |
| JP | 2001-230072 | 8/2001 |
| JP | 2001-319775 | 11/2001 |
| JP | 2002 020169 | 1/2002 |
| JP | 2002-93576 | 3/2002 |
| JP | 2002-100472 | 4/2002 |
| JP | 2002-117777 | 4/2002 |
| JP | 2002 117777 | 4/2002 |
| JP | 2002 170664 | 6/2002 |
| JP | 2002-216951 | 8/2002 |

| | | |
|---|---|---|
| JP | 2002-280169 | 9/2002 |
| JP | 2002-318547 | 10/2002 |
| JP | 2001-324662 | 11/2002 |
| JP | 2002-359070 | 12/2002 |
| JP | 2003-123966 | 4/2003 |
| JP | 2003-228302 | 8/2003 |
| JP | 2003 243160 | 8/2003 |
| JP | 2003 297552 | 10/2003 |
| JP | 2003-332061 | 11/2003 |
| JP | 2004 29552 | 1/2004 |
| JP | 2004 070351 | 3/2004 |
| JP | 04-151656 | 5/2004 |
| JP | 2004-172048 | 6/2004 |
| JP | 2004 303733 | 10/2004 |
| JP | 2004 319103 | 11/2004 |
| JP | 2005-049808 | 2/2005 |
| JP | 2005-71984 | 3/2005 |
| JP | 2005-112676 | 4/2005 |
| JP | 2005-510831 | 4/2005 |
| JP | 2005-123089 | 5/2005 |
| JP | 2005 158672 | 6/2005 |
| JP | 2005 190683 | 7/2005 |
| JP | 2005 251415 | 9/2005 |
| JP | 2005 258405 | 9/2005 |
| JP | 2005 340020 | 12/2005 |
| JP | 2006 524419 | 10/2006 |
| KR | 10-2000-0045292 | 7/2000 |
| KR | 10-2001-0084380 | 9/2001 |
| KR | 10-2002-0051153 | 6/2002 |
| KR | 10-2003-0044656 | 6/2003 |
| KR | 10-2004-0011138 | 2/2004 |
| KR | 10-2005-070543 | 7/2005 |
| KR | 10-2005-0112318 | 11/2005 |
| KR | 10-2005-0115408 | 12/2005 |
| KR | 10-2006-0005369 | 1/2006 |
| KR | 10-2006-0011831 | 2/2006 |
| TW | 569166 | 1/2004 |
| TW | I227094 | 1/2005 |
| TW | I228686 | 3/2005 |
| TW | I237218 | 8/2005 |
| TW | 200541379 | 12/2005 |
| TW | 200541382 | 12/2005 |
| WO | WO 02/21557 | 3/2002 |
| WO | WO 03/005774 | 1/2003 |
| WO | WO 2004-095597 | 4/2004 |
| WO | WO 2004/094331 A2 | 11/2004 |
| WO | WO 2004/112160 | 12/2004 |
| WO | WO 2005/050751 | 6/2005 |
| WO | WO 2007/067420 | 6/2007 |

OTHER PUBLICATIONS

Japanese Office Action issued Sep. 8, 2009 in Japanese Patent Application 2007-011996.
U.S. Appl. No. 11/540,150, filed Sep. 29, 2006, and its ongoing prosecution history, including without limitation Office Actions, Amendments, Remarks, and any other potentially relevant documents, Song et al.
U.S. Office Action dated Feb. 2, 2009 in U.S. Appl. No. 11/529,916.
U.S. Office Action dated Apr. 3, 2009 in U.S. Appl. No. 11/529,891.
U.S. Office Action dated Apr. 3, 2009 in U.S. Appl. No. 11/541,055.
U.S. Office Action dated Mar. 29, 2010 in U.S. Appl. No. 11/541,055.
U.S. Office Action dated Aug. 19, 2009 in U.S. Appl. No. 11/529,914.
U.S. Office Action (Advisory Action) dated May 19, 2010 in U.S. Appl. No. 11/529,914.
U.S. Office Action dated Aug. 19, 2010 in U.S. Appl. No. 11/529,914.
U.S. Office Action dated Dec. 30, 2009 in U.S. Appl. No. 11/541,139.
U.S. Office Action dated Nov. 5, 2009 in U.S. Appl. No. 11/541,047.
U.S. Office Action dated Nov. 28, 2007 in U.S. Appl. No. 11/540,150.
U.S. Office Action dated Aug. 21, 2008 in U.S. Appl. No. 11/540,150.
U.S. Office Action dated Nov. 15, 2007 in U.S. Appl. No. 11/541,009.
U.S. Office Action dated Jun. 19, 2008 in U.S. Appl. No. 11/541,009.
U.S. Office Action dated Dec. 3, 2008 in U.S. Appl. No. 11/541,009.
U.S. Office Action dated Apr. 30, 2009 in U.S. Appl. No. 11/540,151.
U.S. Office Action dated Feb. 11, 2009 in U.S. Appl. No. 11/529,883.
U.S. Office Action dated Jul. 17, 2009 in U.S. Appl. No. 11/529,883.
U.S. Office Action dated Dec. 30, 2009 in U.S. Appl. No. 11/541,048.
U.S. Office Action dated Dec. 8, 2008 in U.S. Appl. No. 11/540,021.
U.S. Office Action dated Apr. 27, 2009 in U.S. Appl. No. 11/540,021.
U.S. Office Action dated Feb. 19, 2009 in U.S. Appl. No. 11/540,024.
U.S. Office Action dated May 8, 2009 in U.S. Appl. No. 11/540,149.
Extended European Search Report dated Feb. 7, 2011 in corresponding Application No. 07250317.0.

* cited by examiner

ORGANIC LIGHT EMITTING DISPLAY DEVICE AND MANUFACTURING METHOD THEREOF

CROSS-REFERENCE TO RELATED APPLICATIONS

This application claims the benefit of Korean Patent Application Nos. 10-2006-0008462, filed on Jan. 26, 2006 and 10-2006-0016188, filed on Feb. 20, 2006 in the Korean Intellectual Property Office, the disclosure of which is incorporated herein by reference.

This application is related to and incorporates herein by reference the entire contents of the following concurrently filed applications:

| Title | Filing Date | Application No. |
|---|---|---|
| ORGANIC LIGHT-EMITTING DISPLAY DEVICE AND METHOD OF FABRICATING THE SAME | Sep. 29, 2006 | 11/541,055 |
| ORGANIC LIGHT-EMITTING DISPLAY DEVICE AND METHOD OF MANUFACTURING THE SAME | Sep. 29, 2006 | 11/529,914 |
| ORGANIC LIGHT EMITTING DISPLAY DEVICE | Sep. 29, 2006 | 11/541,139 |
| ORGANIC LIGHT-EMITTING DISPLAY DEVICE WITH FRIT SEAL AND REINFORCING STRUCTURE | Sep. 29, 2006 | 11/541,047 |
| ORGANIC LIGHT EMITTING DISPLAY DEVICE METHOD OF FABRICATING THE SAME | Sep. 29, 2006 | 11/540,150 |
| ORGANIC LIGHT EMITTING DISPLAY AND METHOD OF FABRICATING THE SAME | Sep. 29, 2006 | 11/541,009 |
| ORGANIC LIGHT-EMITTING DISPLAY DEVICE WITH FRIT SEAL AND REINFORCING STRUCTURE BONDED TO FRAME | Sep. 29, 2006 | 11/540,151 |
| METHOD FOR PACKAGING ORGANIC LIGHT EMITTING DISPLAY WITH FRIT SEAL AND REINFORCING STURUTURE | Sep. 29, 2006 | 11/529,910 |
| METHOD FOR PACKAGING ORGANIC LIGHT EMITTING DISPLAY WITH FRIT SEAL AND REINFORCING STURUTURE | Sep. 29, 2006 | 11/540,084 |
| ORGANIC LIGHT-EMITTING DISPLAY DEVICE AND THE PREPARATION METHOD OF THE SAME | Sep. 29, 2006 | 11/540,008 |
| ORGANIC LIGHT EMITTING DISPLAY AND FABRICATING METHOD OF THE SAME | Sep. 29, 2006 | 11/541,048 |
| ORGANIC LIGHT-EMITTING DISPLAY AND METHOD OF MAKING THE SAME | Sep. 29, 2006 | 11/540,021 |
| ORGANIC LIGHT EMITTING DISPLAY AND FABRICATING METHOD OF THE SAME | Sep. 29, 2006 | 11/540,024 |
| ORGANIC LIGHT-EMITTING DISPLAY DEVICE AND MANUFACTURING METHOD OF THE SAME | Sep. 29, 2006 | 11/540,157 |
| ORGANIC LIGHT EMITTING DISPLAY AND FABRICATING METHOD OF THE SAME | Sep. 29, 2006 | 11/540,149 |
| ORGANIC LIGHT EMITTING DISPLAY AND METHOD OF FABRICATING THE SAME | Sep. 29, 2006 | 11/529,916 |
| ORGANIC LIGHT EMITTING DISPLAY DEVICE METHOD OF FABRICATING THE SAME | Sep. 29, 2006 | 11/529,891 |
| ORGANIC LIGHT EMITTING DISPLAY AND METHOD OF FABRICATING THE SAME | Sep. 29, 2006 | 11/540,103 |

BACKGROUND OF THE INVENTION

1. Field of the Invention

The present invention relates to a method of manufacturing an organic light emitting display device, and more specifically, to packaging of an organic light emitting display device.

2. Description of the Related Technology

In general, an organic light emitting display (OLED) device includes a substrate having a pixel region and a non-pixel region, and another substrate arranged to be opposite to and attached to the substrate with a sealant such as an epoxy for its encapsulation.

The pixel region of the substrate includes multiple light-emitting elements in a matrix form between a scan line and a data line. The light-emitting element may include an anode electrode and cathode electrode, and an organic thin film layer formed between the anode electrode and cathode electrode. The organic thin film layer may include an hole transport layer, an organic light-emitting layer and an electron transport layer.

The light-emitting elements described above are susceptible to hydrogen and oxygen because it contains organic materials. In addition, the cathode electrode is easily oxidized by moisture in the air since it is made of metal materials, thus causing deterioration in electrical and light-emitting properties. To prevent the above problems, an OLED may have a powder-type moisture absorbent or a film-type moisture absorbent on a vessel manufactured in the form of a metal material can or cup, or a substrate made of glass, plastic, etc. to get rid of moisture, oxygen and hydrogen penetrated from the outside.

However, the method of coating the powder-type moisture absorbent needs complicated processes and raises cost for its materials and the processes. In addition, the method increases the thickness of the display device and is difficult to be applied to a top emitting light-emitting type. In addition, the method of attaching the film-type moisture absorbent has a limited ability to eliminate all the moisture and also has low durability and reliability, thus making it difficult to be applied to mass production.

A method has been proposed which encapsulates light-emitting elements by forming side walls with frits to overcome the above problems. International patent application No. PCT/KR2002/000994 (May 24, 2002) discloses an encapsulation container formed with side walls using a glass flit and a manufacturing method thereof. Korean patent laying-open gazette No. 2001-0084380 (Sep. 6, 2001) discloses a flit frame encapsulation method using a laser. Korean patent laying-open gazette No. 2002-0051153 (Jun. 28, 2002) discloses a packaging method of encapsulating an upper substrate and a lower substrate with a frit layer using a laser.

In a method of encapsulating light-emitting elements with a frit, an encapsulation substrate coated with the flit is attached to another substrate having light-emitting elements and a laser beam is irradiated on onto the back surface of the encapsulation substrate so that the frit is fused and attached to the substrate.

The temperature of the substrate is kept lower than that of the encapsulation substrate, since the laser reaches the substrate through the encapsulation substrate and the frit. For example, when the laser is irradiated, the temperature of the encapsulation substrate rises up to about 1000° C., but the temperature of the substrate only rises to about 600° C. Thus, the frit may be attached to the substrate without being completely fused. An interfacial adhesive strength between the frit and substrate may become weak, so that the display device is easily separable even when a slight impact is applied thereto or a force is applied to either of the substrate or encapsulation substrate.

In a method of attaching the frit on the substrate using a laser, the laser is illuminated onto the frit. However, in such a method, the laser beam is focused on the mid-portion of the width of the frit, and thus the power of the laser is weak on edges of the frit, which may lead to incomplete curing of the frit. The discussion in this section is to provide background information of the related technology and does not constitute an admission of prior art.

SUMMARY OF CERTAIN INVENTIVE ASPECTS

One aspect of the invention provides an organic light emitting display device. The device comprises: a first substrate; a second substrate; an array of organic light emitting pixels interposed between the first and second substrates; and a frit seal interposed between the first and second substrates while surrounding the array, wherein the frit seal, the first substrate and the second substrate in combination enclose the array; wherein a first cross-section of the frit seal does not comprise two or more portions that are distinct from one another, wherein the first cross-section is taken in a plane perpendicular to a first elongation of the frit seal.

The first cross-section may be generally homogeneous in color throughout. The first cross-section may be generally homogeneous in morphology throughout. The frit seal comprising the first cross-section may be formed by applying a laser beam to a frit seal material formed generally in the shape of the frit seal between the first and second substrates, and the laser beam may be applied to the frit seal material substantially throughout the first cross-section. The laser beam applied to the frit seal material may be wider than the first cross-section. The laser beam may have a width greater than the width of the first cross-section by about 0.6 mm to about 1.5 mm.

A second cross-section may be taken in a plane perpendicular to a second elongation of the frit seal, and the second cross-section may comprise at least two portions that are distinct from each other. The at least two portions may be distinct in their darkness or color. The at least two portions in the second cross-section may comprise a first portion, a second portion and a third portion, the second portion being interposed between the first and third portion in the second cross-section, the second portion being distinct from the first and third portions. The second portion may comprise about 50% to about 80% of the total area of the second cross-section.

The frit seal may comprise a plurality of elongated segments, each elongated segment at one end thereof contacting another elongated segment extending in a different direction, and a first one of the segment may be substantially homogeneous throughout. The frit seal may be substantially homogeneous throughout the plurality of segments.

Another aspect of the invention provides a method of making an organic light emitting display device. The method comprises: providing an intermediate device comprising: a first substrate, which is single layered or multiple layered, a second substrate, which is single layered or multiple layered, an array of organic light emitting pixels interposed between the first and second substrates, and a frit interposed between the first and second substrates while surrounding the array such that the frit, the first substrate and the second substrate in combination enclose the array; and applying a laser beam to the frit so as to bond the frit to the first and second substrates, wherein after applying the laser beam, a cross-section of the frit does not comprise two or more portions that are distinct from one another, wherein the cross-section is taken in a plane perpendicular to an elongation of the frit.

The cross-section may be generally homogeneous in color or darkness throughout. The cross-section may be generally homogeneous in morphology throughout. The laser beam may be applied to the frit substantially throughout the cross-section. The laser beam applied to the frit may be wider than the cross-section. The laser beam may have a width greater than the width of the cross-section by about 0.6 mm to about 1.5 mm. Applying the laser beam may comprise moving the laser beam along the first elongation of the frit at a speed of about 10 to about 40 mm/sec.

The intermediate device may further comprise: a plurality of additional arrays of organic light-emitting pixels interposed between the first and second substrates; and a plurality of additional frits interposed between the first and second substrates, each of the additional frits surrounding one of the additional arrays, wherein the method further comprises applying laser to each of the additional frit so as to bond the frit to the first and second substrates. The method may further comprise cutting the resulting product into a plurality of pieces, each comprising a cut-portion of the first substrate, a cut-portion of the second substrate, the array of organic light-emitting pixels, and the frit.

Another aspect of the invention provides a manufacturing method of an organic light emitting display device, which allows a frit to be sufficiently fused by adjusting power of a laser such that a width of the laser beam is above a width of the frit and illuminating the laser beam.

Another aspect of the invention provides an organic light emitting display device which allows a frit to be sufficiently fused by adjusting laser beam such that a solid line with a predetermined percentage of a width of the frit is formed and illuminating the laser beam, and a manufacturing method thereof.

Still another aspect of the invention provides a manufacturing method of an organic light emitting display device which allows for enhancing the adhesive strength between a frit and substrate, and a manufacturing method thereof. The manufacturing method of an organic light emitting display device comprises the steps of forming an organic light emitting element comprising a first electrode, an organic thin film and a second electrode on a pixel region of a first substrate divided into the pixel region and a non-pixel region, forming a frit along a surrounding of a second substrate corresponding to the non-pixel region, arranging the second substrate on an upper side of the first substrate to be superposed to a part of the pixel region and the non-pixel region, and attaching the first substrate and the second substrate by illuminating laser beam with a width above a width of the frit from a back surface of the second substrate.

Another aspect of the invention provides an organic light emitting display device which comprises a first substrate divided into a pixel region and a non-pixel region, the pixel region formed with an organic light emitting element comprising a first electrode, an organic thin film layer, and a second electrode, a second substrate arranged to correspond to a part of the pixel region and non-pixel region of the first substrate, and a frit formed with a predetermined width along a surrounding of the non-pixel region between the first substrate and the second substrate, wherein the frit formed with a solid line with a predetermined percentage relative to a predetermined width of the frit through the illumination of the laser beam.

Still another aspect of the invention provides a manufacturing method of an organic light emitting display device which comprises the steps of forming an organic light emitting element comprising a first electrode, an organic thin film and a second electrode on a pixel region of a first substrate divided into the pixel region and a non-pixel region, forming a frit along a surrounding of a second substrate corresponding to the non-pixel region, arranging the second substrate on an upper side of the first substrate to be superposed to a part of the pixel region and the non-pixel region, and attaching the first substrate and the second substrate by illuminating laser beam from a back surface of the second substrate so that a solid line with a predetermined percentage of a width of the frit is formed.

BRIEF DESCRIPTION OF THE DRAWINGS

These and/or other objects and advantages of the invention will become apparent and more readily appreciated from the following description of the embodiments, taken in conjunction with the accompanying drawings of which.

DETAILED DESCRIPTION OF CERTAIN INVENTIVE EMBODIMENTS

Hereinafter, embodiments of the invention will be described in a more detailed manner with reference to the accompanying drawings. It should be understood that the following embodiments will be provided to allow those skilled in the art to fully understand the invention, but the invention does not limited thereto, and various modifications can be made.

An organic light emitting display (OLED) is a display device comprising an array of organic light emitting diodes. Organic light emitting diodes are solid state devices which include an organic material and are adapted to generate and emit light when appropriate electrical potentials are applied.

Figure 7A:
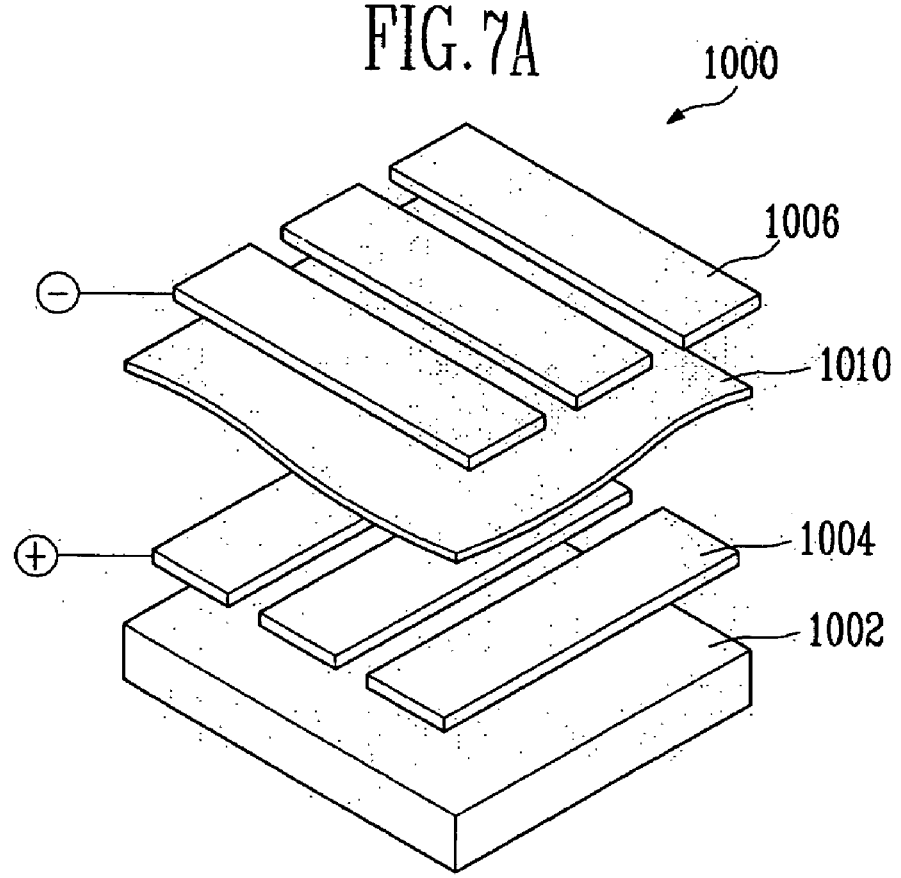
FIG. 7A is a schematic exploded view of a passive matrix type organic light emitting display device in accordance with one embodiment.
Figure 7B:
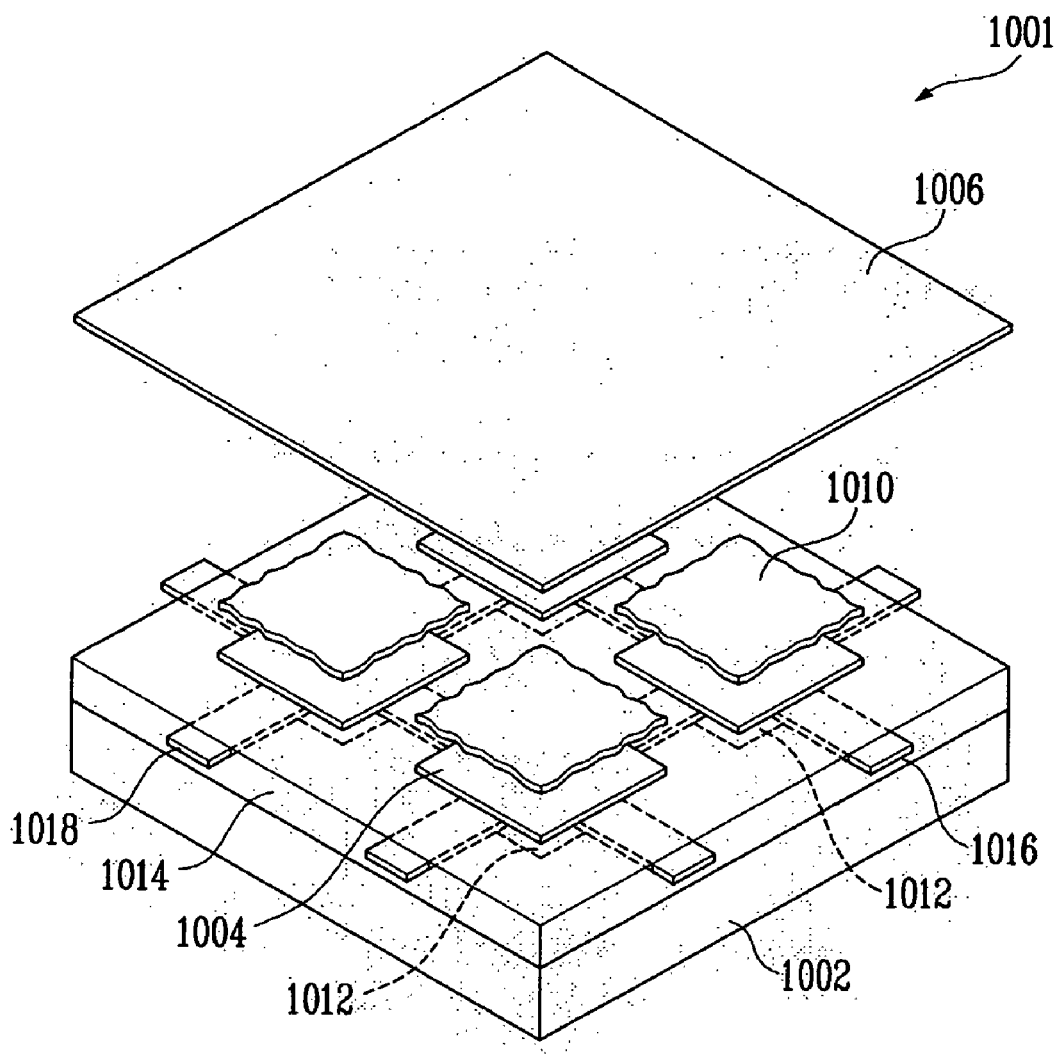
FIG. 7B is a schematic exploded view of an active matrix type organic light emitting display device in accordance with one embodiment.

OLEDs can be generally grouped into two basic types dependent on the arrangement with which the stimulating electrical current is provided. FIG. 7A schematically illustrates an exploded view of a simplified structure of a passive matrix type OLED 1000. FIG. 7B schematically illustrates a simplified structure of an active matrix type OLED 1001. In both configurations, the OLED 1000, 1001 includes OLED pixels built over a substrate 1002, and the OLED pixels include an anode 1004, a cathode 1006 and an organic layer 1010. When an appropriate electrical current is applied to the anode 1004, electric current flows through the pixels and visible light is emitted from the organic layer.

Referring to FIG. 7A, the passive matrix OLED (PMOLED) design includes elongate strips of anode 1004 arranged generally perpendicular to elongate strips of cathode 1006 with organic layers interposed therebetween. The intersections of the strips of cathode 1006 and anode 1004 define individual OLED pixels where light is generated and emitted upon appropriate excitation of the corresponding strips of anode 1004 and cathode 1006. PMOLEDs provide the advantage of relatively simple fabrication.

Referring to FIG. 7B, the active matrix OLED (AMOLED) includes driving circuits 1012 arranged between the substrate 1002 and an array of OLED pixels. An individual pixel of AMOLEDs is defined between the common cathode 1006 and an anode 1004, which is electrically isolated from other anodes. Each local driving circuit 1012 is coupled with an anode 1004 of the OLED pixels and further coupled with a data line 1016 and a scan line 1018. In embodiments, the scan lines 1018 supply scan signals that select rows of the driving circuits, and the data lines 1016 supply data signals for particular driving circuits. The data signals and scan signals stimulate the local driving circuits 1012, which excite the anodes 1004 so as to emit light from their corresponding pixels.

In the illustrated AMOLED, the local driving circuits 1012, the data lines 1016 and scan lines 1018 are buried in a planarization layer 1014, which is interposed between the pixel array and the substrate 1002. The planarization layer 1014 provides a planar top surface on which the organic light emitting pixel array is formed. The planarization layer 1014 may be formed of organic or inorganic materials, and formed of two or more layers although shown as a single layer. The local driving circuits 1012 are typically formed with thin film transistors (TFT) and arranged in a grid or array under the OLED pixel array. The local driving circuits 1012 may be at least partly made of organic materials, including organic TFT. AMOLEDs have the advantage of fast response time improving their desirability for use in displaying data signals. Also, AMOLEDs have the advantages of consuming less power than passive matrix OLEDs.

Referring to common features of the PMOLED and AMOLED designs, the substrate 1002 provides structural support for the OLED pixels and circuits. In various embodiments, the substrate 1002 can comprise rigid or flexible materials as well as opaque or transparent materials, such as plastic, glass, and/or foil. As noted above, each OLED pixel or diode is formed with the anode 1004, cathode 1006 and organic layer 1010 interposed therebetween. When an appropriate electrical current is applied to the anode 1004, the cathode 1006 injects electrons and the anode 1004 injects holes. In certain embodiments, the anode 1004 and cathode 1006 are inverted; i.e., the cathode is formed on the substrate 1002 and the anode is opposingly arranged.

Interposed between the cathode 1006 and anode 1004 are one or more organic layers. More specifically, at least one emissive or light emitting layer is interposed between the cathode 1006 and anode 1004. The light emitting layer may comprise one or more light emitting organic compounds. Typically, the light emitting layer is configured to emit visible light in a single color such as blue, green, red or white. In the illustrated embodiment, one organic layer 1010 is formed between the cathode 1006 and anode 1004 and acts as a light emitting layer. Additional layers, which can be formed between the anode 1004 and cathode 1006, can include a hole transporting layer, a hole injection layer, an electron transporting layer and an electron injection layer.

Hole transporting and/or injection layers can be interposed between the light emitting layer 1010 and the anode 1004. Electron transporting and/or injecting layers can be interposed between the cathode 1006 and the light emitting layer 1010. The electron injection layer facilitates injection of electrons from the cathode 1006 toward the light emitting layer 1010 by reducing the work function for injecting electrons from the cathode 1006. Similarly, the hole injection layer facilitates injection of holes from the anode 1004 toward the light emitting layer 1010. The hole and electron transporting layers facilitate movement of the carriers injected from the respective electrodes toward the light emitting layer.

In some embodiments, a single layer may serve both electron injection and transportation functions or both hole injection and transportation functions. In some embodiments, one or more of these layers are lacking. In some embodiments, one or more organic layers are doped with one or more materials that help injection and/or transportation of the carriers. In embodiments where only one organic layer is formed between the cathode and anode, the organic layer may include not only an organic light emitting compound but also certain functional materials that help injection or transportation of carriers within that layer.

There are numerous organic materials that have been developed for use in these layers including the light emitting layer. Also, numerous other organic materials for use in these layers are being developed. In some embodiments, these organic materials may be macromolecules including oligomers and polymers. In some embodiments, the organic materials for these layers may be relatively small molecules. The skilled artisan will be able to select appropriate materials for each of these layers in view of the desired functions of the individual layers and the materials for the neighboring layers in particular designs.

In operation, an electrical circuit provides appropriate potential between the cathode 1006 and anode 1004. This results in an electrical current flowing from the anode 1004 to the cathode 1006 via the interposed organic layer(s). In one embodiment, the cathode 1006 provides electrons to the adjacent organic layer 1010. The anode 1004 injects holes to the organic layer 1010. The holes and electrons recombine in the organic layer 1010 and generate energy particles called "excitons." The excitons transfer their energy to the organic light emitting material in the organic layer 1010, and the energy is used to emit visible light from the organic light emitting material. The spectral characteristics of light generated and emitted by the OLED 1000, 1001 depend on the nature and composition of organic molecules in the organic layer(s). The composition of the one or more organic layers can be selected to suit the needs of a particular application by one of ordinary skill in the art.

OLED devices can also be categorized based on the direction of the light emission. In one type referred to as "top emission" type, OLED devices emit light and display images through the cathode or top electrode 1006. In these embodiments, the cathode 1006 is made of a material transparent or at least partially transparent with respect to visible light. In certain embodiments, to avoid losing any light that can pass through the anode or bottom electrode 1004, the anode may be made of a material substantially reflective of the visible light. A second type of OLED devices emits light through the anode or bottom electrode 1004 and is called "bottom emission" type. In the bottom emission type OLED devices, the anode 1004 is made of a material which is at least partially transparent with respect to visible light. Often, in bottom emission type OLED devices, the cathode 1006 is made of a material substantially reflective of the visible light. A third type of OLED devices emits light in two directions, e.g. through both anode 1004 and cathode 1006. Depending upon the direction(s) of the light emission, the substrate may be formed of a material which is transparent, opaque or reflective of visible light.

Figure 7C:
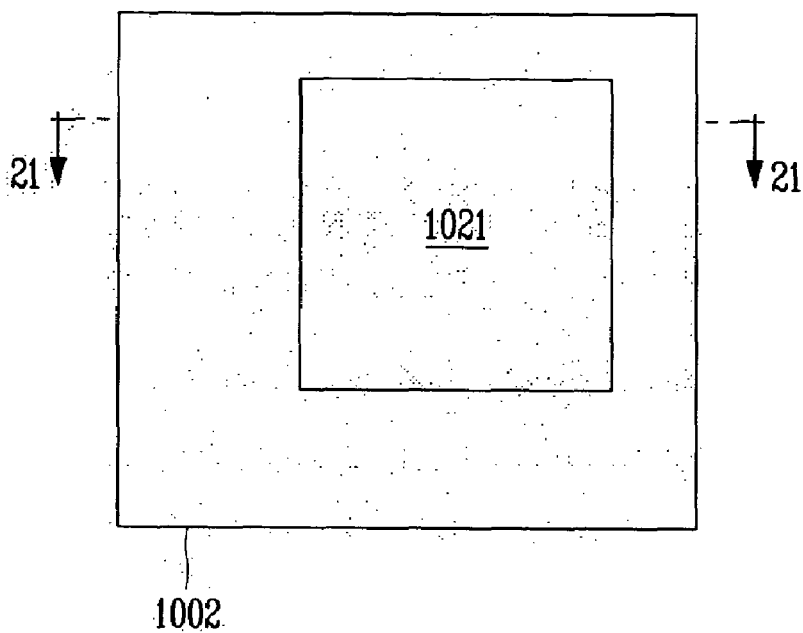
FIG. 7C is a schematic top plan view of an organic light emitting display in accordance with one embodiment.

In many embodiments, an OLED pixel array 1021 comprising a plurality of organic light emitting pixels is arranged over a substrate 1002 as shown in FIG. 7C. In embodiments, the pixels in the array 1021 are controlled to be turned on and off by a driving circuit (not shown), and the plurality of the pixels as a whole displays information or image on the array 1021. In certain embodiments, the OLED pixel array 1021 is arranged with respect to other components, such as drive and control electronics to define a display region and a non-display region. In these embodiments, the display region refers to the area of the substrate 1002 where OLED pixel array 1021 is formed. The non-display region refers to the remaining areas of the substrate 1002. In embodiments, the non-display region can contain logic and/or power supply circuitry. It will be understood that there will be at least portions of control/drive circuit elements arranged within the display region. For example, in PMOLEDs, conductive components will extend into the display region to provide appropriate potential to the anode and cathodes. In AMOLEDs, local driving circuits and data/scan lines coupled with the driving circuits will extend into the display region to drive and control the individual pixels of the AMOLEDs.

Figure 7D:
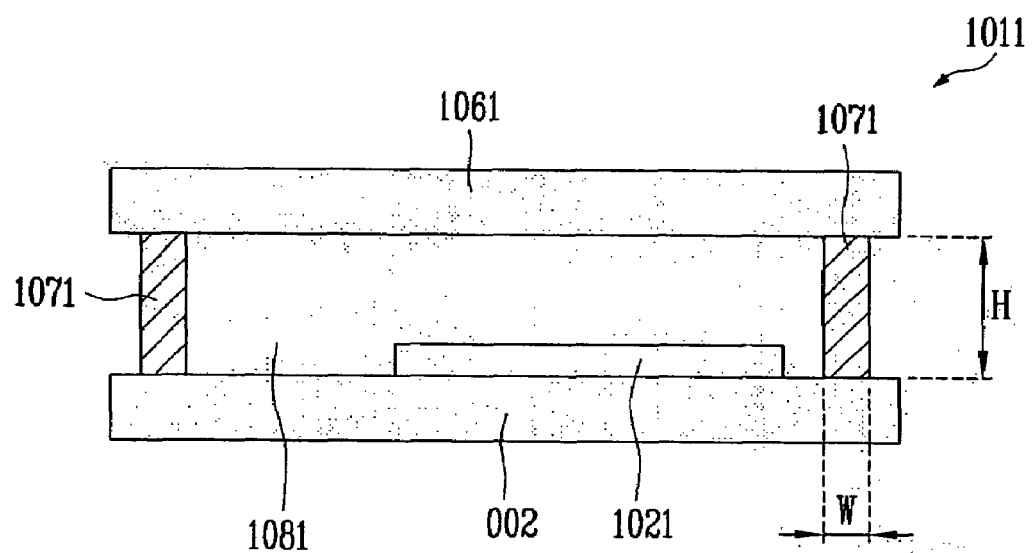
FIG. 7D is a cross-sectional view of the organic light emitting display of FIG. 7C, taken along the line d-d.

One design and fabrication consideration in OLED devices is that certain organic material layers of OLED devices can suffer damage or accelerated deterioration from exposure to water, oxygen or other harmful gases. Accordingly, it is generally understood that OLED devices be sealed or encapsulated to inhibit exposure to moisture and oxygen or other harmful gases found in a manufacturing or operational environment. FIG. 7D schematically illustrates a cross-section of an encapsulated OLED device 1011 having a layout of FIG. 7C and taken along the line d-d of FIG. 7C. In this embodiment, a generally planar top plate or substrate 1061 engages with a seal 1071 which further engages with a bottom plate or substrate 1002 to enclose or encapsulate the OLED pixel array 1021. In other embodiments, one or more layers are formed on the top plate 1061 or bottom plate 1002, and the seal 1071 is coupled with the bottom or top substrate 1002, 1061 via such a layer. In the illustrated embodiment, the seal 1071 extends along the periphery of the OLED pixel array 1021 or the bottom or top plate 1002, 1061.

In embodiments, the seal 1071 is made of a frit material as will be further discussed below. In various embodiments, the top and bottom plates 1061, 1002 comprise materials such as plastics, glass and/or metal foils which can provide a barrier to passage of oxygen and/or water to thereby protect the OLED pixel array 1021 from exposure to these substances. In embodiments, at least one of the top plate 1061 and the bottom plate 1002 are formed of a substantially transparent material.

To lengthen the life time of OLED devices 1011, it is generally desired that seal 1071 and the top and bottom plates 1061, 1002 provide a substantially non-permeable seal to oxygen and water vapor and provide a substantially hermetically enclosed space 1081. In certain applications, it is indicated that the seal 1071 of a frit material in combination with the top and bottom plates 1061, 1002 provide a barrier to oxygen of less than approximately $10^{-3}$ cc/m$^2$-day and to water of less than $10^{-6}$ g/m$^2$-day. Given that some oxygen and moisture can permeate into the enclosed space 1081, in some embodiments, a material that can take up oxygen and/or moisture is formed within the enclosed space 1081.

The seal 1071 has a width W, which is its thickness in a direction parallel to a surface of the top or bottom substrate 1061, 1002 as shown in FIG. 7D. The width varies among embodiments and ranges from about 300 μm to about 3000 μm, optionally from about 500 μm to about 1500 μm. Also, the width may vary at different positions of the seal 1071. In some embodiments, the width of the seal 1071 may be the largest where the seal 1071 contacts one of the bottom and top substrate 1002, 1061 or a layer formed thereon. The width may be the smallest where the seal 1071 contacts the other. The width variation in a single cross-section of the seal 1071 relates to the cross-sectional shape of the seal 1071 and other design parameters.

The seal 1071 has a height H, which is its thickness in a direction perpendicular to a surface of the top or bottom substrate 1061, 1002 as shown in FIG. 7D. The height varies among embodiments and ranges from about 2 μm to about 30 μm, optionally from about 10 μm to about 15 μm. Generally, the height does not significantly vary at different positions of the seal 1071. However, in certain embodiments, the height of the seal 1071 may vary at different positions thereof.

In the illustrated embodiment, the seal 1071 has a generally rectangular cross-section. In other embodiments, however, the seal 1071 can have other various cross-sectional shapes such as a generally square cross-section, a generally square cross-section, a generally trapezoidal cross-section, a cross-section with one or more rounded edges, or other configuration as indicated by the needs of a given application. To improve hermetically, it is generally desired to increase the interfacial area where the seal 1071 directly contacts the bottom or top substrate 1002, 1061 or a layer formed thereon. In some embodiments, the shape of the seal can be designed such that the interfacial area can be increased.

The seal 1071 can be arranged immediately adjacent the OLED array 1021, and in other embodiments, the seal 1071 is spaced some distance from the OLED array 1021. In certain embodiment, the seal 1071 comprises generally linear segments that are connected together to surround the OLED array 1021. Such linear segments of the seal 1071 can extend, in certain embodiments, generally parallel to respective boundaries of the OLED array 1021. In other embodiment, one or more of the linear segments of the seal 1071 are arranged in a non-parallel relationship with respective boundaries of the OLED array 1021. In yet other embodiments, at least part of the seal 1071 extends between the top plate 1061 and bottom plate 1002 in a curvilinear manner.

As noted above, in certain embodiments, the seal 1071 is formed using a frit material or simply "frit" or glass frit," which includes fine glass particles. The frit particles includes one or more of magnesium oxide (MgO), calcium oxide (CaO), barium oxide (BaO), lithium oxide (Li$_2$O), sodium oxide (Na$_2$O), potassium oxide (K$_2$O), boron oxide (B$_2$O$_3$), vanadium oxide (V$_2$O$_5$), zinc oxide (ZnO), tellurium oxide (TeO$_2$), aluminum oxide (Al$_2$O$_3$), silicon dioxide (SiO$_2$), lead oxide (PbO), tin oxide (SnO), phosphorous oxide (P$_2$O$_5$), ruthenium oxide (Ru$_2$O), rubidium oxide (Rb$_2$O), rhodium oxide (Rh$_2$O), ferrite oxide (Fe$_2$O$_3$), copper oxide (CuO), titanium oxide (TiO$_2$), tungsten oxide (WO$_3$), bismuth oxide (Bi$_2$O$_3$), antimony oxide (Sb$_2$O$_3$), lead-borate glass, tin-phosphate glass, vanadate glass, and borosilicate, etc. In embodiments, these particles range in size from about 2 μm to about 30 μm, optionally about 5 μm to about 10 μm, although not limited only thereto. The particles can be as large as about the distance between the top and bottom substrates 1061, 1002 or any layers formed on these substrates where the frit seal 1071 contacts.

The frit material used to form the seal 1071 can also include one or more filler or additive materials. The filler or additive materials can be provided to adjust an overall thermal expansion characteristic of the seal 1071 and/or to adjust the absorption characteristics of the seal 1071 for selected frequencies of incident radiant energy. The filler or additive material(s) can also include inversion and/or additive fillers to adjust a coefficient of thermal expansion of the frit. For example, the filler or additive materials can include transition metals, such as chromium (Cr), iron (Fe), manganese (Mn), cobalt (Co), copper (Cu), and/or vanadium. Additional materials for the filler or additives include ZnSiO$_4$, PbTiO$_3$, ZrO$_2$, eucryptite.

In embodiments, a frit material as a dry composition contains glass particles from about 20 to 90 about wt %, and the remaining includes fillers and/or additives. In some embodiments, the frit paste contains about 10-30 wt % organic materials and about 70-90% inorganic materials. In some embodiments, the frit paste contains about 20 wt % organic materials and about 80 wt % inorganic materials. In some embodiments, the organic materials may include about 0-30 wt % binder(s) and about 70-100 wt % solvent(s). In some embodiments, about 10 wt % is binder(s) and about 90 wt % is solvent(s) among the organic materials. In some embodiments, the inorganic materials may include about 0-10 wt % additives, about 20-40 wt % fillers and about 50-80 wt % glass powder. In some embodiments, about 0-5 wt % is additive(s), about 25-30 wt % is filler(s) and about 65-75 wt % is the glass powder among the inorganic materials.

In forming a frit seal, a liquid material is added to the dry frit material to form a frit paste. Any organic or inorganic solvent with or without additives can be used as the liquid material. In embodiments, the solvent includes one or more organic compounds. For example, applicable organic compounds are ethyl cellulose, nitro cellulose, hydroxyl propyl cellulose, butyl carbitol acetate, terpineol, butyl cellusolve, acrylate compounds. Then, the thus formed frit paste can be applied to form a shape of the seal 1071 on the top and/or bottom plate 1061, 1002.

In one exemplary embodiment, a shape of the seal 1071 is initially formed from the frit paste and interposed between the top plate 1061 and the bottom plate 1002. The seal 1071 can in certain embodiments be pre-cured or pre-sintered to one of the top plate and bottom plate 1061, 1002. Following assembly of the top plate 1061 and the bottom plate 1002 with the seal 1071 interposed therebetween, portions of the seal 1071 are selectively heated such that the frit material forming the seal 1071 at least partially melts. The seal 1071 is then allowed to resolidify to form a secure joint between the top plate 1061 and the bottom plate 1002 to thereby inhibit exposure of the enclosed OLED pixel array 1021 to oxygen or water.

In embodiments, the selective heating of the frit seal is carried out by irradiation of light, such as a laser or directed infrared lamp. As previously noted, the frit material forming the seal 1071 can be combined with one or more additives or filler such as species selected for improved absorption of the irradiated light to facilitate heating and melting of the frit material to form the seal 1071.

Figure 7E:
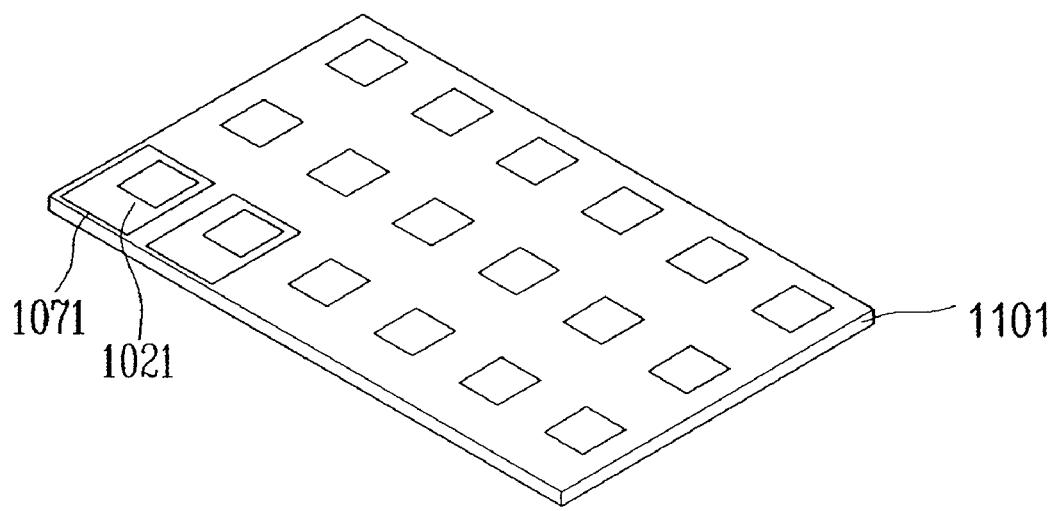
FIG. 7E is a schematic perspective view illustrating mass production of organic light emitting devices in accordance with one embodiment.

In some embodiments, OLED devices 1011 are mass produced. In an embodiment illustrated in FIG. 7E, a plurality of separate OLED arrays 1021 is formed on a common bottom substrate 1101. In the illustrated embodiment, each OLED array 1021 is surrounded by a shaped frit to form the seal

1071. In embodiments, common top substrate (not shown) is placed over the common bottom substrate 1101 and the structures formed thereon such that the OLED arrays 1021 and the shaped frit paste are interposed between the common bottom substrate 1101 and the common top substrate. The OLED arrays 1021 are, encapsulated and sealed, such as via the previously described enclosure process for a single OLED display device. The resulting product includes a plurality of OLED devices kept together by the common bottom and top substrates. Then, the resulting product is cut into a plurality of pieces, each of which constitutes an OLED device 1011 of FIG. 7D. In certain embodiments, the individual OLED devices 1011 then further undergo additional packaging operations to further improve the sealing formed by the frit seal 1071 and the top and bottom substrates 1061, 1002.

Figure 1A:
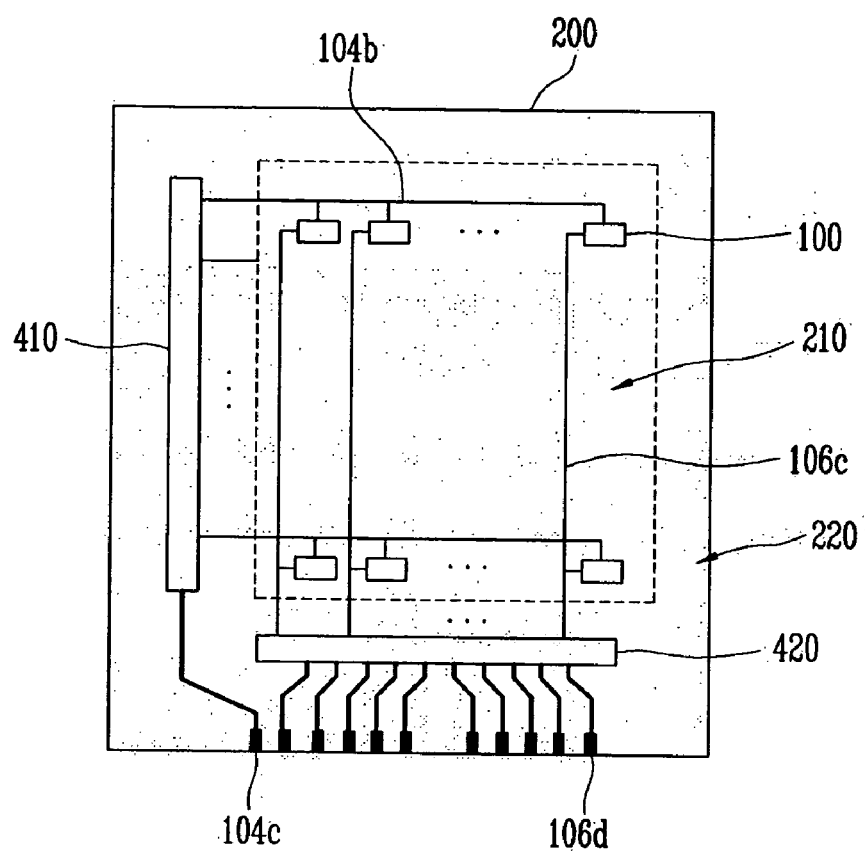
FIGS. 1A, 2A and 3A are schematic top plan views illustrating a manufacturing method of an organic light emitting display device according to a first embodiment.
Figure 1B:
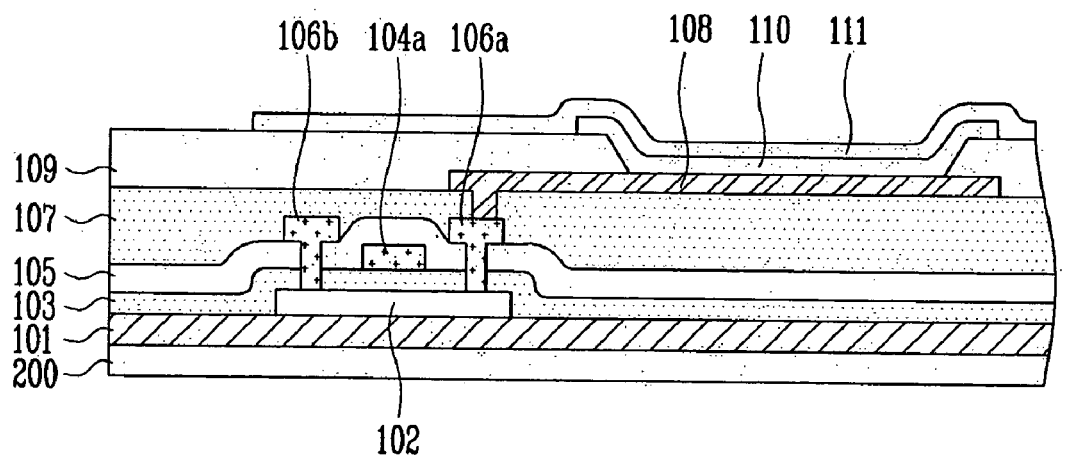
FIGS. 1B, 2B and 3B are schematic cross-sectional views illustrating the manufacturing method of an organic light emitting display device according to the first embodiment.
Figure 2A:
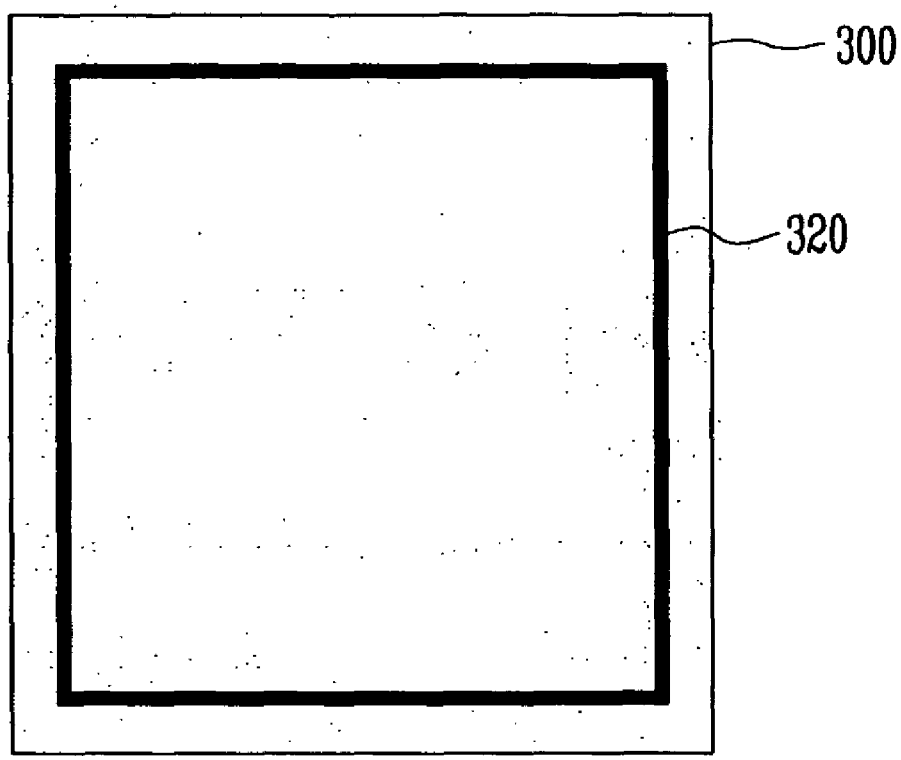
Figure 2B:
Figure 3A:
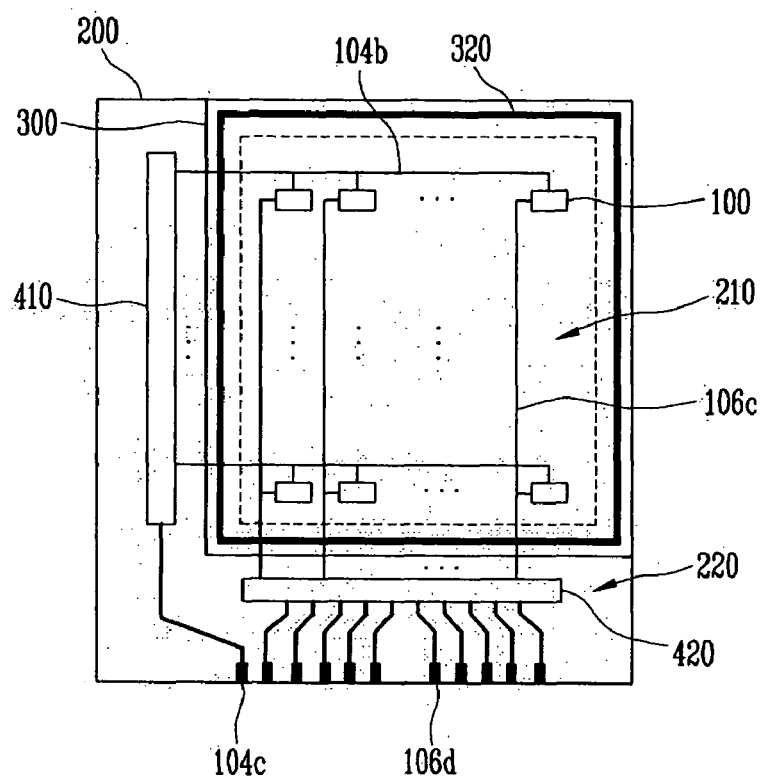
Figure 3B:
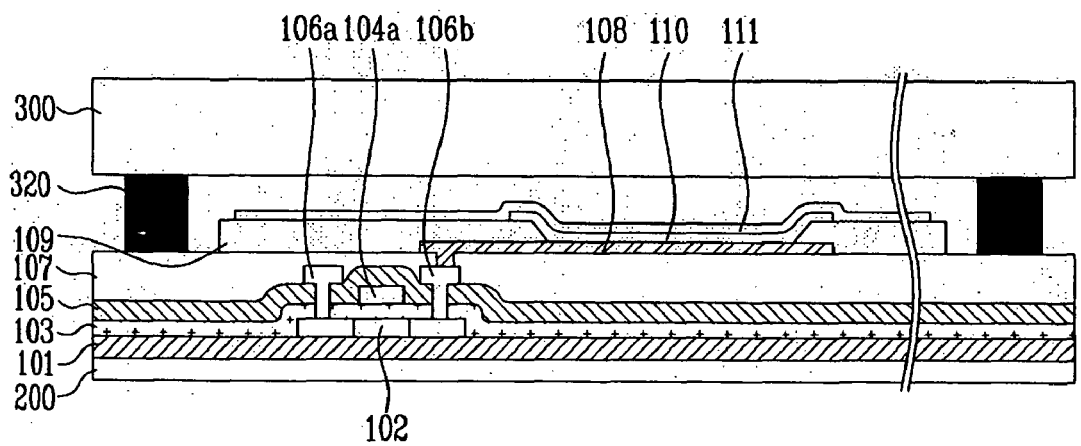

FIGS. 1A, 2A and 3A are plan views for illustrating a manufacturing method of an organic light emitting display device (OLED) according to a first embodiment, and FIGS. 1B, 2B and 3B are cross-sectional views thereof.

Referring to FIGS. 1B and 1B, a substrate 200 includes a pixel region 210 and a non-pixel region 220 surrounding the pixel region 210. The pixel region 210 of the substrate 200 may include multiple organic light emitting elements 100, which are connected to one another in the matrix form between a scan line 104b and a data line 106c. The non-pixel region 220 of the substrate 200 may include i) a scan line 104b and a data line 106c extending from the scan line 104b and the data line 106c, respectively, of the pixel region 210, ii) a power supply line (not shown) for generating the organic light emitting elements 100, and iii) a scan driver 410 and a data driver 420 for processing signals from the external through pads 104c and 106d and supplying them to the scan line 104b and data line 106c.

The organic light emitting element 100 may include an anode electrode 108 and cathode electrode 111, and an organic thin film layer 110 formed between the anode electrode 108 and cathode electrode 111. The organic thin film layer 110 may include a hole transport layer, an organic light-emitting layer and an electron transport layer, and may further include an hole injection layer and an electron injection layer. In addition, the organic light emitting elements 100 may further include a switching transistor for controlling their operation and a capacitor for maintaining signals.

More details will be described below with reference to FIG. 1B with respect to a manufacturing process of the organic light emitting element 100. First, a buffer layer 101 may be formed on the pixel region 210 and non-pixel region 220 of the substrate 200. The buffer layer 101 serves to prevent damages to the substrate 200 due to heat and to isolate diffusion of ions from the substrate 200 to the outside. The buffer layer 101 may be formed as an insulating film such as silicon oxide film $SiO_2$ or silicon nitride film SiNx.

A semiconductor layer 102, which serves as an active layer, may be formed over the buffer layer 101 of the pixel region 210. Then, a gate insulating film 103 is formed over the substantially entire upper surface of the pixel region 210 including the semi conductor layer 102.

A gate electrode 104a may be formed over the gate insulating film 103 which is over the upper side of the semiconductor layer 102. The pixel region 210 may include a scan line connected to the gate electrode 104a. The non-pixel region 220 may include a scan line 104b extending from the scan line 104 of the pixel region 210 and a pad 104c to receive signals from external sources. The gate electrode 104a, scan line 104b and pad 104c may include metals such as Mo, W, Ti, Al, or an alloy thereof, and may have a stacked layer structure.

An interlayer insulating film 105 may be formed over the substantially entire upper surface of the pixel region 210 including the gate electrode 104a. Contact holes may be formed to expose predetermined portions of the semiconductor layer 102 through the between-layer insulating film 105 and gate insulating film 103. A source electrode 106a and a drain electrode 106b are formed to be connected through the contact holes to the semiconductor layer 102. The pixel region 210 may include a data line 106c connected to the source and drain electrodes 106a, 106b and the non-pixel region 220 may include a data line 106c extending from the data line 106c of the pixel region 210 and a pad 106d to receive signals from the external sources. The source and drain electrodes 106a and 106b, data line 106c and pad 106d may include a metal such as Mo, W, Ti, Al, or an alloy thereof, and may be formed as a stacking structure.

A planarization layer 107 may be formed over the substantially entire upper surface of the pixel region 210 to planarize the upper surface of the partially fabricated device described above. A via hole may be formed to expose predetermined parts of the source or drain electrode 106a or 106b. An anode electrode 108 may be formed to be connected through the via hole to the source or drain electrode 106a or 106b.

A pixel definition film 109 is formed over the planarization layer 107 so that a part of the anode electrode 108 is exposed. Then, an organic thin film 110 is formed on the exposed anode electrode 108. A cathode electrode 111 is formed on the pixel definition film 109 including the organic thin film layer 110.

Referring to FIGS. 2A and 2B, an encapsulation substrate 300 is provided. The encapsulation substrate 300 has a size sufficient to cover the pixel region 210 and at least a portion of the non-pixel region 220. The encapsulation substrate 300 may include a transparent material such as glass. In another embodiment, the encapsulation substrate may include silicon oxide $SiO_2$.

A frit 320 may be formed on peripheral regions of the encapsulation substrate 300 which correspond to the non-pixel region 220 of the substrate 200. The frit 320 serves to seal the pixel region 210 to prevent a gas such as hydrogen and oxygen or moisture from being penetrated. The frit 320 is formed to surround a part of the non-pixel region 220 and the pixel region 210. A complementary moisture absorbent may further be added to the region enclosed by the frit 320.

The term "frit" may refer to a powder-type glass material. In the context of this document, "frit" may also refer to a frit in a paste form, which may include a laser absorber, an organic binder, a filler for reducing the thermal expansion coefficient, etc. Alternatively, "frit" may refer to a seal formed by curing the frit paste by a laser beam or infrared ray.

In one embodiment, a glass frit in a paste form may include at least one kind of transition metal. The frit may be applied to the encapsulation substrate with a height of about 14 to about 50 μm and a width of about 0.6 to about 1.5 mm using a screen printing or dispensing method. After that, the frit may be sintered so as to eliminate its moisture or organic binder, and then is cured.

Referring to FIGS. 3A and 3B, the encapsulation substrate 300 is arranged over the upper surface of the substrate 200, on which the organic light emitting element 100 is formed, as shown in FIGS. 1A and 1B. The encapsulation substrate 300 covers the pixel region 210 and at least a portion of the non-pixel region 220. The frit 320 may be fused to be attached to the substrate 200 by illuminating a laser beam onto the frit 320 from above the encapsulation substrate 300.

Figure 4A:
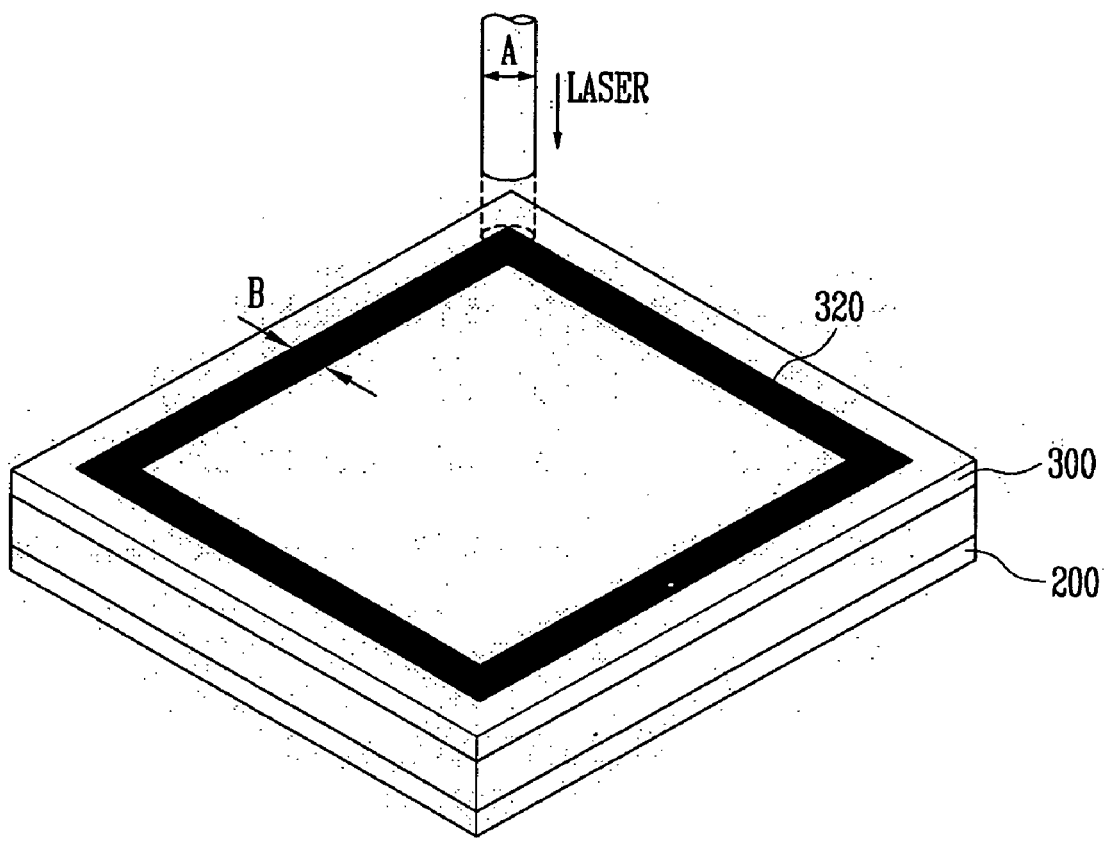
FIGS. 4A and 4B are views illustrating an embodiment where a width of a laser beam is adjusted to a width of a frit.
Figure 4B:
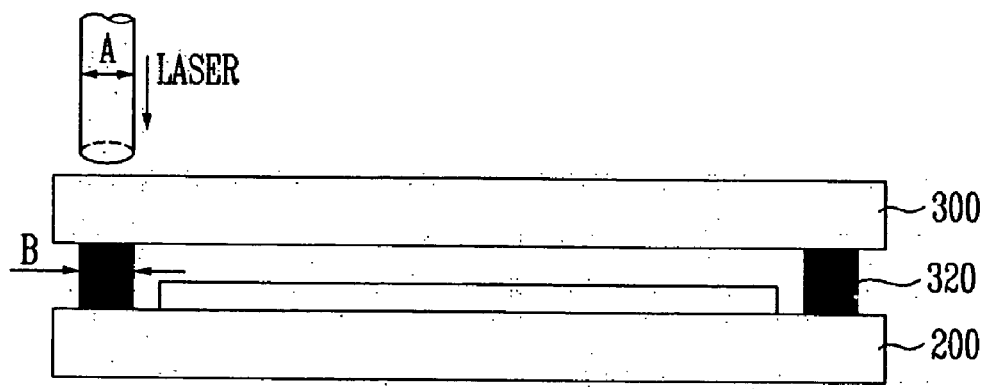

FIGS. 4A and 4B are views of illustrating one embodiment of curing the frit 320 between the substrate 200 and the encapsulation substrate 300. In one embodiment, the laser beam is adjusted to have a width A or diameter larger than a width B of the frit.

Figure 6A:
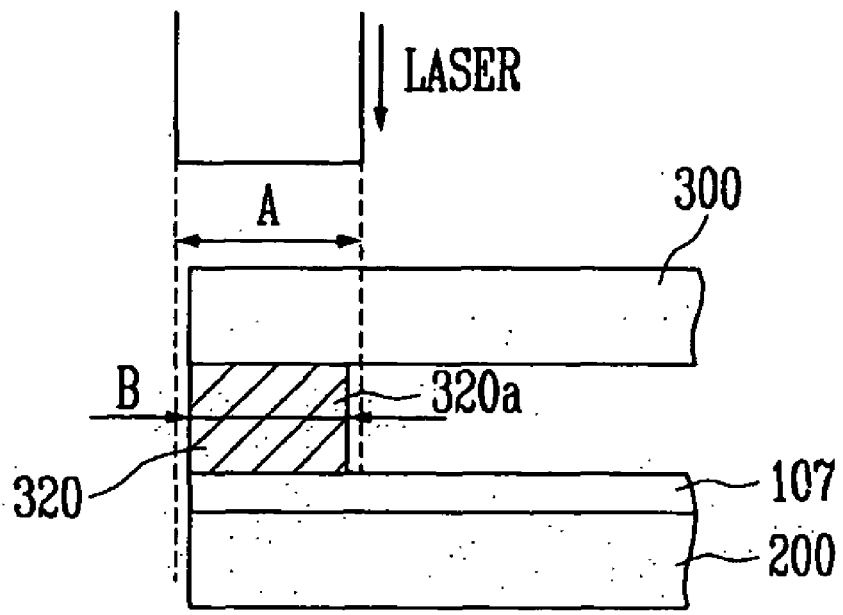
FIGS. 6A-6C illustrates a frit width and a laser beam width according to embodiments.

Referring to FIG. 6A, a laser beam has a width A in the cross-sectional illustration, which is perpendicular to the direction in which the laser beam travels and the frit is elongated. In the context of this document, the width of a frit refers to the length of the cross-section of a frit in the direction where the width A of the laser beam is measured, as shown in FIG. 6A.

Figure 6B:
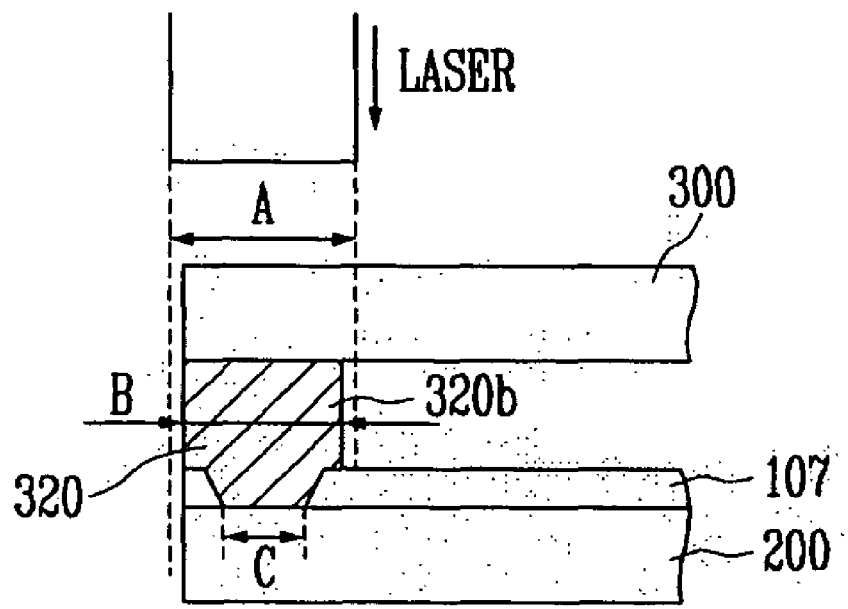
Figure 6C:
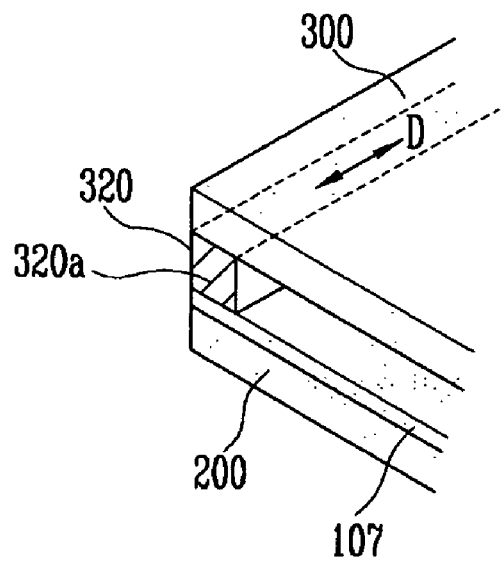

As described above, the OLED includes a fit 320 having portions surrounding the pixel region 210. Referring to FIG. 6C, one of the fit portions extends in a direction D. The cross-section 320a is taken substantially perpendicular to the direction D. The width of the cross-section 320a refers to a width B extending substantially parallel to at least one of the substrates 200, 300. In one embodiment, the width B of the fit 320 is the same throughout the entire cross-section 320a of the fit, as shown in FIG. 6A. In certain embodiments, the frit may have several different widths. For example, in FIG. 6B, the frit 320 has a tapered portion penetrating through the planarization layer 107 down to the substrate 200. The tapered portion narrows as it extends toward the substrate 200. In such an embodiment, the width of the frit refers to the longest width B, e.g., throughout the cross section 320b of the frit as shown in FIG. 6B, rather than other widths such as a width C which is the shortest.

Referring to FIGS. 4A and 4B, the laser beam is irradiated from above the encapsulation substrate. The illustrated laser beam has a width A. The frit may have a width B which is smaller than the width A of the laser beam.

In one embodiment, the laser beam may be adjusted to have a width which is about 0.6 to about 1.5 mm larger than the width of the frit. The laser may be adjusted to have a power of about 36 to about 38 W. The laser may be moved at a constant speed, for example, about 10 to about 40 mm/sec, optionally 20 mm/sec, along the frit 320 to maintain a constant fusion temperature and adhesive strength.

In certain embodiments, the laser beam width may be substantially equal to or smaller than the frit width. In such embodiments, the laser beam may be moved to over edge portions of the frit to effect curing of the edge portions.

In the above embodiments, regions off from the center of the laser beam by a predetermined distance are also illuminated uniformly by the laser beam since the width A of the laser beam is adapted to be larger than the width B of the frit, and thus curing may be completed well all over the frit.

In one embodiment, the display device may be designed such that the laser beam is not illuminated onto a pattern such as a metal line in the non-pixel region 220 of the substrate 200. In such an embodiment, such a pattern may be positioned in a region not exposed to the laser beam. Alternatively, the pattern may be within a region exposed to the laser beam as long as the pattern can be blocked by a certain structure in the region from the laser beam.

In the illustrated embodiment, the frit 320 is formed to seal only the pixel region 210. In another embodiment, the frit may enclose the scan driver 410 as well. In such an embodiment, the size of the encapsulation substrate 300 may need to be changed. In addition, although the embodiment has been described with respect to a case where the frit 320 is formed on the encapsulation substrate 300 first, it is not limited thereto. In other embodiments, the frit 320 may be first formed on the substrate 200, and then the encapsulation substrate 300 may be placed over the substrate 200. Although a laser has been employed to fuse and attach the frit 320 to the substrate 200, other light sources such as an infrared light may also be used.

Figure 5A:
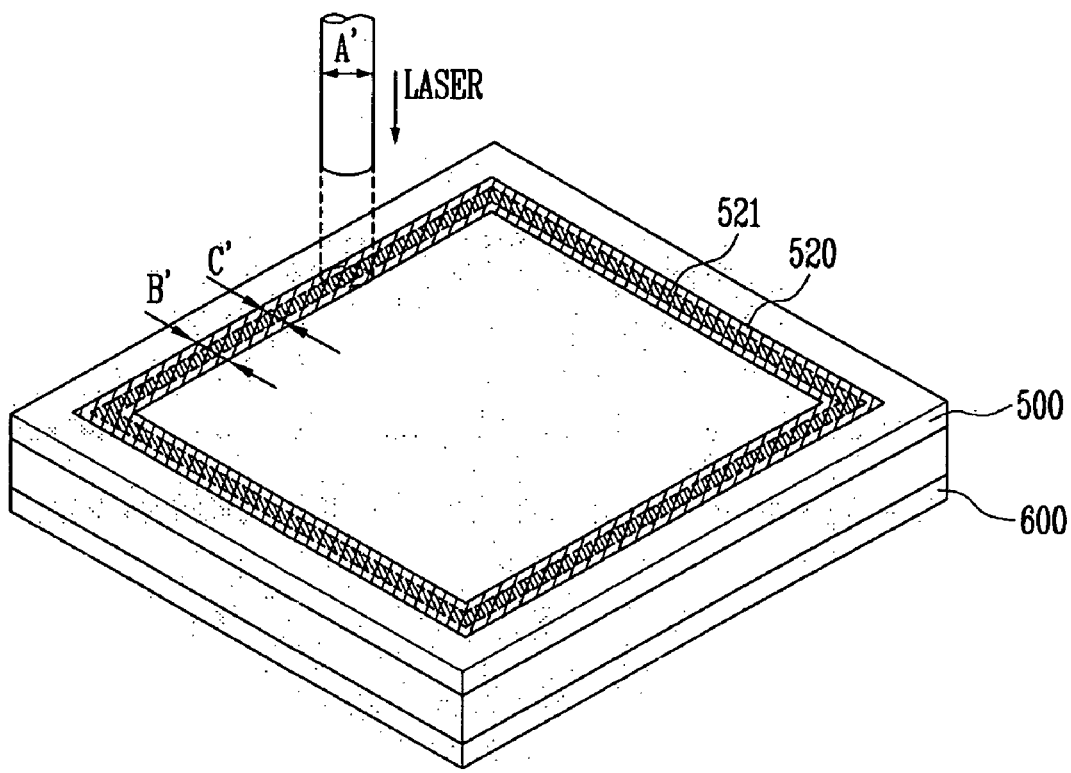
FIGS. 5A and 5B are views of illustrating another embodiment where a width of a laser beam is adjusted so that solid lines are formed with a predetermined ratio of a width of a frit.
Figure 5B:
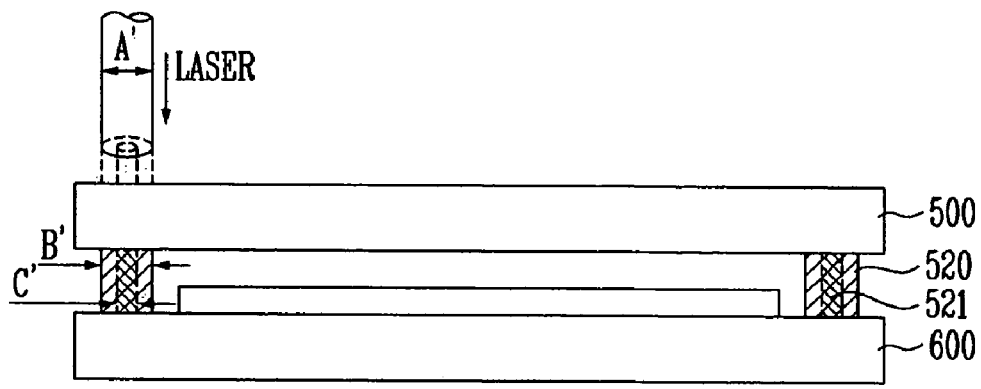

FIGS. 5A and 5B are views of illustrating a second embodiment where a width of a laser beam is adjusted so that solid lines are formed in a predetermined ratio of a width of a frit. Detailed description of the second embodiment will be omitted since the first embodiment may be referred to herein.

Referring to FIGS. 5A and 5B, the first substrate 500 and the second substrate 600 are attached to each other by illuminating a laser beam with a width A' larger than a width B' of the frit from above the second substrate 600.

In one embodiment, the laser beam may be adjusted to have a width which is about 0.6 to about 1.5 mm larger than the width B of the frit. The laser may be adjusted to have a power of about 36 to about 38 W. The laser may be moved at a constant speed, for example, about 10 to about 40 mm/sec, optionally 20 mm/sec, along the frit 520 to maintain a constant fusion temperature and adhesive strength.

When the laser beam is illuminated on the frit 520, the width, in which the frit 520 is substantially cured by the mid-portion of the laser beam, is determined. That is, the mid-portion of the frit 520 is cured such that a solid line 521 is formed on the mid-portion of the frit 520.

In one embodiment, the width C' of the solid line 521 of the frit 520 is about 50 to about 80% of the width of the frit. The width of the laser beam may be adjusted in power so that the width C' of the solid line 521 has a predetermined percentage of the width B' of the frit.

Accordingly, as mentioned above, it can be seen that regions off from the mid-portion of the laser beam by a predetermined distance are also illuminated uniformly by the laser beam since the width A' of the laser beam is adapted to be larger than the width B' of the frit, and the solid line 521 is formed by a predetermined percentage of the frit 520, so that curing may be done well all over the frit.

Although a few embodiments of the invention have been shown and described, it would be appreciated by those skilled in the art that changes might be made in this embodiment without departing from the principles and spirit of the invention, the scope of which is defined in the claims and their equivalents.

What is claimed is:

1. An organic light emitting display device, comprising:
   a first substrate;
   a second substrate;
   an array of organic light emitting pixels interposed between the first and second substrates; and
   a frit seal comprising a plurality of elongated segments interposed between the first and second substrates, the plurality of elongated segments comprises a first segment;
   wherein the plurality of elongated segments in combination surrounds the array, wherein the frit seal, the first substrate and the second substrate in combination enclose the array; wherein the frit seal comprises a first cross-section taken in a plane perpendicular to an elongation of the first segment; and
   wherein the fit seal is generally homogeneous in color or morphology throughout at least a predetermined first portion of the first cross-section, and
   wherein the predetermined first portion of the first cross-section extends across a portion of the first cross-section and is distinct from a second portion of the first cross-section, the first portion having the same composition as the second portion;

wherein the first cross-section further comprises a third portion, the second portion having a uniform makeup and being interposed between the first and third portion, the second portion being distinct from the first and third portions.

2. The device of claim 1, wherein the first cross-section is generally homogeneous in color throughout.

3. The device of claim 1, wherein the first cross-section is generally homogeneous in morphology throughout.

4. The device of claim 1, wherein the frit seal comprising the first cross-section is formed by applying a laser beam to a fit seal material formed generally in the shape of the frit seal between the first and second substrates, and wherein the laser beam is applied to the fit seal material substantially throughout the first cross-section.

5. The device of claim 4, wherein the laser beam applied to the frit seal material is wider than the first cross-section.

6. The device of claim 5, wherein the laser beam has a width greater than the width of the first cross-section by about 0.6 mm to about 1.5 mm.

7. The device of claim 1, wherein the first and second portions are distinct in their darkness or color.

8. The device of claim 1, wherein the second portion comprises about 50% to about 80% of the total area of the first cross-section.

9. The device of claim 1, wherein the frit seal comprises a plurality of elongated segments, each elongated segment at one end thereof contacting another elongated segment extending in a different direction, and wherein a first one of the segment is substantially homogeneous throughout.

10. The device of claim 9, wherein the frit seal is substantially homogeneous throughout the plurality of segments.

11. The device of claim 1, wherein the frit seal comprises one or more materials selected from the group consisting of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate.

12. The device of claim 1, wherein the frit seal is cured at edges of the first cross-section.

13. The device of claim 1, wherein the first portion is integral to the second portion.

* * * * *